United States Patent
Shemesh et al.

(10) Patent No.: US 8,361,814 B2
(45) Date of Patent: Jan. 29, 2013

(54) METHOD FOR MONITORING CHAMBER CLEANLINESS

(75) Inventors: Dror Shemesh, Hod Hasharon (IL); Michal Eilon, Beit Elazari (IL); Hen Doozli, Nes Ziona (IL); Ekaterina Rechav, Rehovot (IL); Eitan Binyamini, Tel-Aviv (IL)

(73) Assignee: Applied Materials, Israel, Ltd., Rehovot (IL)

( * ) Notice: Subject to any disclaimer, the term of this patent is extended or adjusted under 35 U.S.C. 154(b) by 1079 days.

(21) Appl. No.: 11/350,516

(22) Filed: Feb. 9, 2006

(65) Prior Publication Data

US 2006/0216839 A1    Sep. 28, 2006

Related U.S. Application Data

(60) Provisional application No. 60/652,212, filed on Feb. 11, 2005.

(51) Int. Cl.
*G01R 31/26* (2006.01)
*H01L 21/66* (2006.01)
*B08B 3/00* (2006.01)
*B08B 5/00* (2006.01)

(52) U.S. Cl. ............... 438/18; 438/14; 134/30; 134/31
(58) Field of Classification Search ............... 134/2, 30, 134/31, 902; 438/14, 18
See application file for complete search history.

(56) References Cited

U.S. PATENT DOCUMENTS

| | | | | |
|---|---|---|---|---|
| 5,275,667 A | * | 1/1994 | Ganesan et al. | 134/1 |
| 5,930,586 A | * | 7/1999 | Jain et al. | 438/14 |
| 2003/0045098 A1 | * | 3/2003 | Verhaverbeke et al. | 438/689 |
| 2003/0111438 A1 | * | 6/2003 | Mukai et al. | 216/2 |
| 2004/0134515 A1 | * | 7/2004 | Castrucci | 134/2 |

OTHER PUBLICATIONS

Vig, John. Handbook of Semiconductor Wafer Cleaning Technology. Noyes Publications, 1993. Chapter 6: 233-273.*

* cited by examiner

*Primary Examiner* — Michael Kornakov
*Assistant Examiner* — Nicole Blan
(74) *Attorney, Agent, or Firm* — Kilpatrick Townsend & Stockton LLP

(57) ABSTRACT

A method for evaluating a cleanliness of a tool, the method includes: receiving a wafer; cleaning the wafer; placing the wafer into the tool for a predefined period; removing the wafer from the tool, performing a contact angle measurement and determining the cleanliness of the wafer.

17 Claims, 2 Drawing Sheets

METHOD FOR MONITORING CHAMBER CLEANLINESS

RELATED APPLICATIONS

This patent application is a NONPROVISIONAL of and claims priority to U.S. Provisional Patent Application No. 60/652,212, filed Feb. 11, 2005, incorporated herein by reference.

FIELD OF THE INVENTION

The present invention relates to methods and systems for monitoring wafer cleanliness.

BACKGROUND

Advanced processes, 90 nm and below, use extremely thin and sensitive layers. Such layers can be affected by a very small amount of contamination (e.g., less than a monolayer). When a thin contamination layer covers such a sensitive process layer, the process yield can be negatively affected. The contamination level that can cause yield problems is so small and various prior art techniques such as SIMS and RGS are not suitable to measured this layer, due to the contamination they add and due to their limited sensitivity.

An example of an extremely sensitive layers are the Copper Barrier layer and the Copper Seed layer. The thickness of these layers can range between few nanometers to less than a nanometer. Even a sub-monolayer of contamination materials (for example organic layers, hydrocarbons, fluorocarbons, etc.) deposited on these layers can damage overall yield. Such contamination layers are formed in various process and process monitoring tools, including in Scanning Electron Microscopes. The challenge is to reduce the level of contamination, so that yield will not be affected.

One prior art method for monitoring the cleanliness of wafers is the contact angle measurement. Contact angle measurement describes a shape of a liquid droplet that rests on the wafer. The shape of the droplet is represented by an angle between the surface of the wafer and an imaginary tangent line from the droplet to the solid surface.

A conventional contact angle measurement device includes a stage that holds the wafer, a syringe to apply a droplet of liquid, an illuminating light source and a camera that detects the shape of the droplet. The camera is connected to an image processor that can determine the contact angle.

Wafers are processed during a highly complex manufacturing process. During the manufacturing process the wafers travel between multiple manufacturing tools and quality control tools such as wafer inspection tools, defect review tools, metrology tools and the like. These tools are often very large and the wafer travels relatively long distances between one tool to the other.

Contamination and especially very thin (even monolayer) films are formed very quickly. For example, copper layers must be transferred in a short time between one tool to another.

In a typical manufacturing facility multiple wafers are manufactured, while the timing of certain operations relating to a single wafer can slightly differ from tool to tool, and from operator to operator.

SUMMARY OF THE INVENTION

According to various embodiments of the invention a method is provided. The method includes: receiving a wafer; cleaning the wafer; placing the wafer into the tool for a predefined period; removing the wafer from the tool, performing a contact angle measurement and determining the cleanliness of the wafer.

Conveniently, the method includes determining the cleanliness of the tool in response to the cleanliness of the wafer.

Conveniently, the method includes determining whether to clean the tool, in response the cleanliness of the tool.

Conveniently, the method includes performing a wafer related operation and cleaning the wafer.

Conveniently, the method includes exposing the wafer to ultra violet radiation.

Conveniently, the method includes breaking oxygen molecules formed on the wafer into two oxygen atoms.

Conveniently, the method includes illuminating the wafer with Ultra violet light in wavelength of 240 nm or 185 nm.

Conveniently, the method includes directing plasma towards the wafer.

Conveniently, the method includes directing Ozone towards the wafer.

Conveniently, the method includes inserting the wafer into the tool and cleaning the wafer by a cleaning device that is comprised within the tool.

Conveniently, the method includes placing the wafer into the tool for a predefined while activating the tool at a normal operational mode.

Conveniently, the method includes placing the wafer into the tool while activating the tool at a mode that differs from a normal operational mode of the tool.

BRIEF DESCRIPTION OF THE DRAWINGS

The invention is herein described, by way of example only, with reference to the accompanying drawings, wherein.

DETAILED DESCRIPTION

According to an embodiment of the invention the cleanliness of a tool is measured by cleaning the wafer, inserting the wafer into the tool for a predefined period, outputting the wafer, measuring the cleanliness of the wafer and providing an indication about the cleanliness of the tool. This stage can be followed by cleaning the tool, and especially the tool's vacuum chambers.

Figure 1:
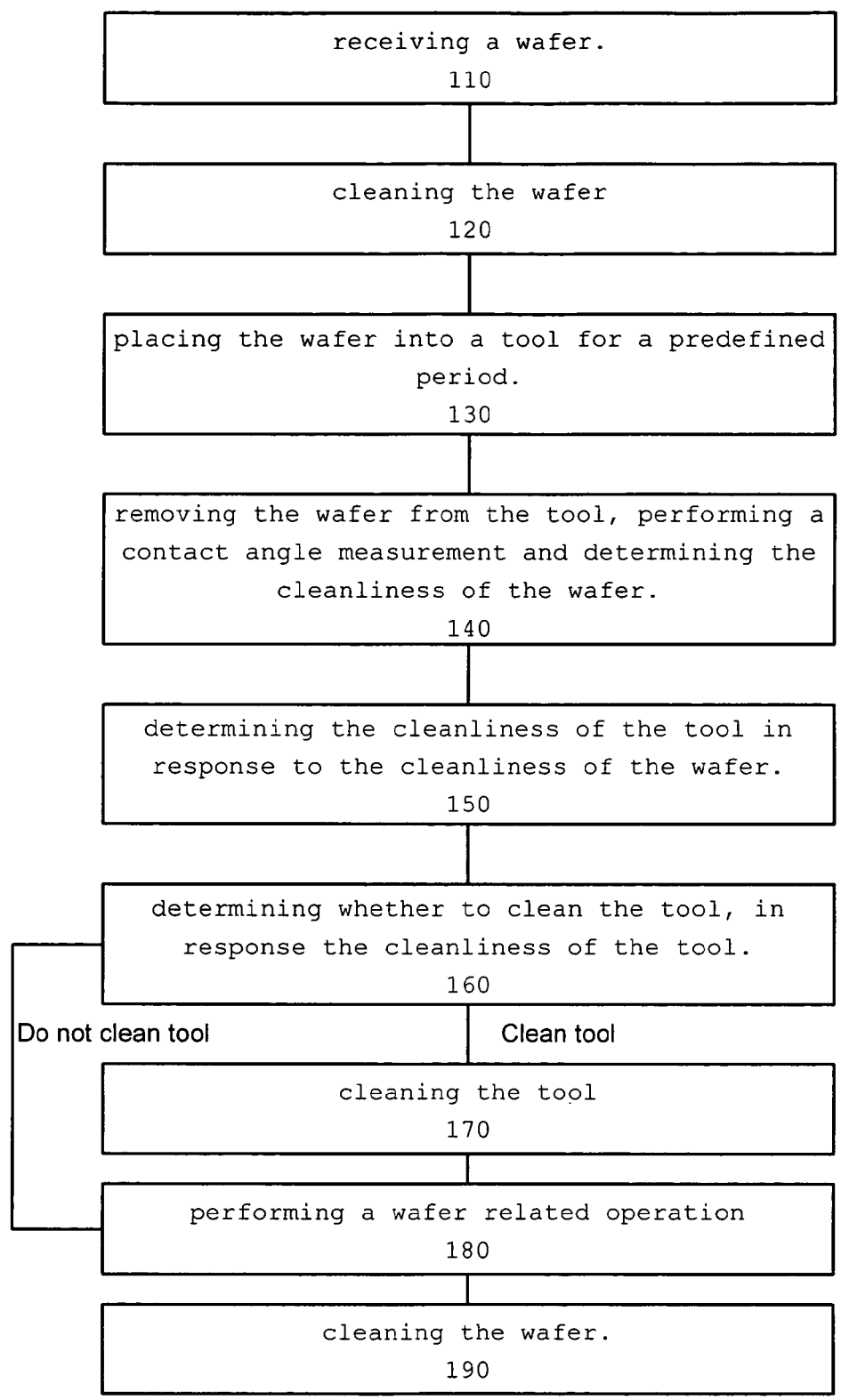
FIG. 1 illustrates method for evaluating a cleanliness of a tool, according to an embodiment of the invention.

FIG. 1 illustrates a method 100 for evaluating a cleanliness of a tool, according to an embodiment of the invention.

Method 100 starts by stage 110 of receiving a wafer.

Stage 110 is followed by stage 120 of cleaning the wafer. Conveniently, stage 120 includes oxidizing particles such as hydro-carbonates such as to convert them to easily pumped gases. For example: $CH_4 + 4O_{(gas)}$ are converted to $CO_{2(gas)} + 2H_2O_{(gas)}$.

Conveniently, stage 120 includes cleaning wafer by exposing them to ultra violet radiation. The inventors exposed wafers to ultra violet radiation for several minutes (eight to ten minutes). The inventors placed the wafer in a ultra violet device such as the UVOCS (UV Ozone cleaning system), available from UVOCS of Montgomeryville, Pa. It is noted that other tools can be used for cleaning the wafer.

Conveniently, stage 120 included breaking oxygen molecules formed on the wafer into two oxygen atoms (sometimes called oxygen radicals). These oxygen atoms interact with oxygen molecules, creating ozone molecules. The inventors have found that oxygen atoms and/or ozone molecules clean wafer surfaces.

Conveniently, stage 120 included using an Ultra violet light source that emits light in wavelength of 240 nm and 185 nm According to another embodiment of the invention the wafer can be exposed to other types of radiations, can be bombarded by plasma, or exposed to other processes that clean the wafer. Conveniently these processes are designed to remove the contamination that is expected to be formed on the wafer. Various prior-art cleaning processes can be applied.

Conveniently stage 120 includes directing plasma towards the wafer. The plasma can be generated by a dedicated device or by the tool that is being evaluated.

Conveniently, stage 120 includes directing Ozone towards the wafer. The Ozone can be generated by a dedicated device or by the tool that is being evaluated.

Stage 120 is followed by stage 130 of placing the wafer into a tool for a predefined period. The wafer is usually placed into a process chamber of the tool or a chamber in which the wafer is placed during an inspection period, a metrology period or a defect review period.

Conveniently, the wafer is placed in a tool while the tool emulates its normal operational mode. For example, if the wafer is placed into a SEM chamber in which a certain vacuum level is maintained during the review of the wafer and a certain amount of stage movement is introduced then during the predefined period the SEM chamber is placed at substantially the same vacuum level and substantially the same amount of movement is introduced.

According to another embodiment of the invention the conditions during this predetermined period can differ from the conditions during the actual operation of the tool. In such a case the relationship between contaminations that develop during this predefined period and between contaminations that is developed during normal operation of the tool is defined. The differences in the conditional can relate to the length of the predefined period and the period during which a wafer is located in the tool during normal operation, to temperature differences, to humidity differences, to vacuum differences and the like.

Stage 130 may include placing the wafer into the tool for a predefined period comprises activating the tool at a normal operational mode during the predefined period.

Stage 130 may include placing the wafer into the tool for a predefined period comprises activating the tool at a mode that differs from a normal operational mode of the tool during the predefined period.

Stage 130 is followed by stage 140 of removing the wafer from the tool, performing a contact angle measurement and determining the cleanliness of the wafer.

Stage 140 is followed by stage 150 of determining the cleanliness of the tool in response to the cleanliness of the wafer. The cleanliness of the tool can be evaluated from the contamination that develops on the wafer during the predetermined period.

Conveniently, if the contact angle was smaller than a threshold (usually 6 degrees), the wafer (and accordingly the tool) was considered clean. Otherwise, it was considered dirty.

Stage 150 is followed by stage 160 of determining whether to clean the tool, in response the cleanliness of the tool.

Stage 160 can be followed by stage 170 of cleaning the tool, especially if the tool was deemed to be unclean. Stage 160 can also be followed by not cleaning the tool.

Stage 150 can also be followed by stage 180 of performing a wafer related operation, such as inspecting the wafer, measuring various features of the wafer, processing the wafer, and the like. During this stage the tool can operate in its normal operational mode.

Stage 180 can be followed by stage 190 of cleaning the wafer. Thus, after the wafer is processed it can be cleaned, especially by using the cleaning processes utilized during stage 120. Stage 190 can be responsive to the expected cleanliness level of the wafer. This level can be determined in view of the previous contact angle measurement. Cleaner wafers can be cleaned by applying a shorter cleaning period.

Figure 2:
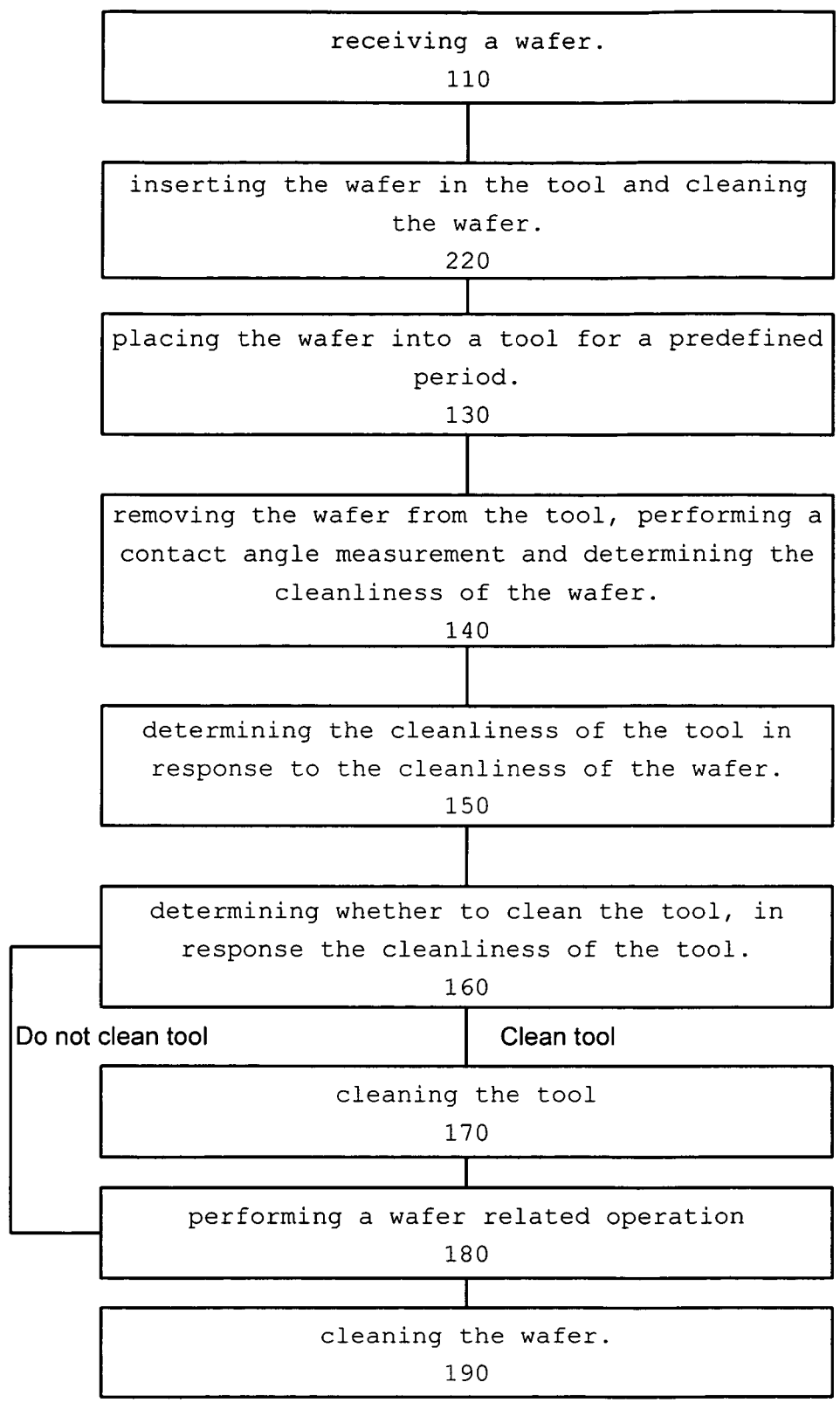
FIG. 2 illustrates method for evaluating a cleanliness of a tool, according to an embodiment of the invention.

FIG. 2 illustrates a method 200 for evaluating a cleanliness of a tool, according to an embodiment of the invention.

Method 200 differs from method 100 by using a cleaning device that is located within the evaluated tool. Accordingly, the wafer in inserted to the tool, cleaned and then sent to another chamber of the tool for a predefined period.

According to an embodiment of the invention the UV light source can be integrated into the SEM chamber, or to the load lock. According to another embodiment of the invention the UV light source can be integrated in the next stage process tool (rather than a SEM tool), so that the process tool will ensure a clean wafer before processing the next step.

Method 200 starts by stage 110 of receiving a wafer.

Stage 110 is followed by stage 220 of inserting the wafer in the tool and cleaning the wafer. Stage 220 can apply any of the cleaning processes of stage 120.

Stage 220 is followed by stage 130 of removing the wafer from the tool, performing a contact angle measurement and Stage 130 is followed by stage 140 of removing the wafer from the tool, performing a contact angle measurement and determining the cleanliness of the wafer.

Stage 130 is followed by stage 140 of determining the cleanliness of the tool in response to the cleanliness of the wafer.

Stage 140 is followed by stage 150 of cleaning the tool, especially if the tool was deemed to be unclean.

Stage 140 can also be followed by stage 160 of performing a wafer related operation, such as inspecting the wafer, measuring various features of the wafer, processing the wafer, and the like. During this stage the tool can operate in its normal operational mode.

Stage 160 is followed by stage 170 of cleaning the wafer. Thus, after the wafer is processed it can be cleaned, especially by using the cleaning processes utilized during stage 120.

The UVOCS a small chamber located in the atmosphere. A mercury lamp is the UV light source (240 nm and 185 nm lines). It is used for applications that require ultra-clean surfaces.

TABLE 1 illustrates exemplary contact angles.

TABLE 1

Example of Contact Angle Results (in degrees)

| Material (the material on which the droplet is formed) | Contact angle (degrees) |
| --- | --- |
| Silicone | 5-10, |
| | 6-8 defined clean |
| | 8-8.5 substantially clean |
| | 8.51-10 dirty |
| Native Oxide | 20-30 |
| HMDS (adhesion prometer) | 65076 |
| Polymers (very dirty) | 55-110 |

While the invention has been described with respect to a limited number of embodiments, it will be appreciated that many variations, modifications and other applications of the invention may be made.

We claim:

1. A method for evaluating a cleanliness of a metrology tool that includes a chamber, the method comprising:
    cleaning a wafer;
    placing said wafer, after cleaning, into the chamber for a predefined period and operating the metrology tool in a mode so that conditions in the chamber emulate an operational mode of the metrology tool;
    removing the wafer from the chamber of the tool at the conclusion of the predefined period;
    evaluating the cleanliness of the tool by determining the cleanliness of the wafer based on a contact angle measurement performed on the wafer, said measurement performed subsequent to removing the wafer from the chamber and prior to any additional cleaning step.

2. The method according to claim 1 further comprising determining whether to clean the tool, in response the cleanliness of the tool.

3. The method according to claim 2 further comprising performing a wafer related operation on the wafer, wherein the wafer related operation includes at least one of inspecting, processing, and analyzing the wafer.

4. The method according to claim 1 wherein the wafer was cleaned prior to being placed in the chamber of the tool by exposing the wafer to ultra violet radiation.

5. The method according to claim 1 wherein the wafer was cleaned prior to being placed in the chamber of the tool by breaking oxygen molecules formed on the wafer into two oxygen atoms.

6. The method according to claim 1 wherein the wafer was cleaned prior to being placed in the chamber of the tool by illuminating the wafer with ultra violet light in wavelength of 240 nm or 185 nm.

7. The method according to claim 1 wherein the wafer was cleaned prior to being placed in the chamber of the tool by directing plasma towards the wafer.

8. The method according to claim 1 wherein the wafer was cleaned prior to being placed in the chamber of the tool by directing ozone towards the wafer.

9. The method according to claim 1 wherein the placing the wafer into the tool for a predefined period comprises activating the tool in a normal SEM operational mode during the predefined period.

10. The method according to claim 1 wherein the placing the wafer into the tool for a predefined period comprises activating the tool in a mode that differs from a normal SEM operational mode of the tool during the predefined period.

11. The method of claim 1 wherein the tool includes a cleaning device, the method further comprising cleaning the wafer prior to placing the wafer in the chamber of the tool.

12. The method according to claim 11 further comprising performing a wafer related operation on the wafer, wherein the wafer related operation includes at least one of inspecting, processing, and analyzing the wafer.

13. The method according to claim 11 wherein the cleaning comprises exposing the wafer to ultra violet radiation.

14. The method according to claim 11 wherein the cleaning comprises breaking oxygen molecules formed on the wafer into two oxygen atoms.

15. The method according to claim 11 wherein the cleaning comprises illuminating the wafer with ultra violet light in wavelength of 240 nm or 185 nm.

16. The method according to claim 11 wherein the cleaning comprises directing plasma towards the wafer.

17. The method according to claim 11 wherein the cleaning comprises directing ozone towards the wafer.

* * * * *